US006373285B1

(12) United States Patent
Konishi

(10) Patent No.: US 6,373,285 B1
(45) Date of Patent: Apr. 16, 2002

(54) LEVEL SHIFT CIRCUIT

(75) Inventor: Hiroyuki Konishi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 39 days.

(21) Appl. No.: 09/590,260

(22) Filed: Jun. 9, 2000

(30) Foreign Application Priority Data

Jun. 10, 1999 (JP) ........................................ 11-163271

(51) Int. Cl.[7] ........................................ H03K 19/0175

(52) U.S. Cl. ........................................ 326/81; 326/68

(58) Field of Search ........................... 326/80, 81, 63, 326/68, 70, 71

(56) References Cited

U.S. PATENT DOCUMENTS

| | | | | |
|---|---|---|---|---|
| 5,825,205 A | | 10/1998 | Ohtsuka | |
| 5,896,044 A | * | 4/1999 | Walden | 326/80 |
| 6,040,708 A | * | 3/2000 | Blake et al. | 326/33 |
| 6,064,229 A | * | 5/2000 | Morris | 326/81 |

FOREIGN PATENT DOCUMENTS

| | | |
|---|---|---|
| JP | 7-321638 | 12/1995 |

* cited by examiner

*Primary Examiner*—Michael Tokar
*Assistant Examiner*—Daniel D. Chang
(74) *Attorney, Agent, or Firm*—McDermott, Will & Emery

(57) ABSTRACT

In the level shift circuit, the input unit is connected to the first power source and the ground, and the output unit is connected to the second power source and the ground. The input unit receives a signal changing between the ground potential and the power supply potential of the first power source and outputs the signal. The output unit receives this signal from the input unit, and voltage-shifts it into a signal changing between the ground potential and the power supply potential of the second power source. The output unit includes an interruption circuit which cuts off the current path from the second power source to the ground via the output unit. The output unit also includes a potential detection circuit which detects the time when the first power source is interrupted, and outputs a control signal. When the first power source is interrupted, the control signal of the potential detection circuit causes the interruption circuit to cut off the current path. As a result, it is secured to prevent the through current from flowing to the output unit in the power down mode.

2 Claims, 7 Drawing Sheets

LEVEL SHIFT CIRCUIT

BACKGROUND OF THE INVENTION

The present invention relates to a level shift circuit.

In the prior art mixed analog-and-digital LSI, a digital block unit X and an analog block unit Y share a power source 66 as shown in FIG. 4. In general, in such a mixed analog-and-digital LSI, the digital block unit whose voltage can be easily lowered derives power having a lower voltage than in the analog block unit Y so as to reduce power consumption in the digital block unit X, thereby to realize low power consumption.

As shown in FIG. 5, in the mixed analog-and-digital LSI which realizes low power consumption with the above structure generally includes a level shift circuit Z which level-shifts a signal received from the digital block unit (digital circuit) X into a high-voltage signal, and enters the level-shifted signal into the analog block unit (analog circuit) Y which has a different power supply voltage from the digital block unit X.

FIG. 3 is a circuit diagram showing the structure of the prior art level shift circuit Z used in the above-mentioned mixed analog-and-digital LSI.

The structure and behavior of the level shift circuit Z which is composed of CMOS transistors will be described as follows based on FIG. 3. The level shift circuit Z consists of an input unit 41 which operates from a ground potential Vss and a first power source 65, and an output unit 42 which operates from the ground potential Vss and a second power source 66.

The input unit 41 has a first CMOS inverter circuit 45 and a second CMOS inverter circuit 48. The first CMOS inverter circuit 45 has a PMOS transistor 43 and a NMOS transistor 44 arranged in series between the ground potential Vss and the first power source 65, and their gates and drains are connected, respectively. Similarly, the second CMOS inverter circuit 48 has a PMOS transistor 46 and a NMOS transistor 47 arranged in series between the ground potential Vss and the first power source 65, and their gates and drains are connected to each other. The first inverter circuit 45 has an input terminal 49 at which a digital signal is entered from the digital block unit X. The digital signal changes its value between the ground potential Vss and the power supply voltage of the first power source 65. The first inverter circuit 45 has an output terminal 50 connected to the input terminal 51 of the second inverter circuit 48.

The output unit 42 operates from the ground potential Vss and the second power source 66. Between the ground potential Vss and the second power source 66, there are PMOS transistors 53, 54 whose sources are connected to the second power source 66, and NMOS transistors 55, 56 whose sources are connected to the ground potential Vss. A third CMOS inverter circuit 61 is further arranged between the ground potential Vss and the second power source 66. The third CMOS inverter circuit 61 is composed of a PMOS transistor 59 and a NMOS transistor 60 whose respective gates and drains are connected to each other. The PMOS transistor 53 and the NMOS transistor 55 share a drain 57, and the PMOS transistor 54 and the NMOS transistor 56 share a drain 58. The gate of the PMOS transistor 53 is connected to the drain 58 of the PMOS transistor 54 and the NMOS transistor 56, and the gate of the NMOS transistor 55 is connected to the output terminal 52 of the second inverter circuit 48 in the input unit 41. The gate of the PMOS transistor 54 is connected to the drain 57 of the PMOS transistor 53 and the NMOS transistor 55, and the gate of the NMOS transistor 56 is connected to the output terminal 50 of the first inverter circuit 45. The drain 57 of the PMOS transistor 53 and the NMOS transistor 55 is also connected to the input terminal of the third inverter circuit 61. The third inverter circuit 61 has an output terminal 62, which becomes the output of the output unit 42, and further becomes the level-shifted output of the level shift circuit z.

The behavior of the level shift circuit Z shown in FIG. 3 will be described as follows.

When the input unit 41 is supplied with the ground potential Vss and the first power source 65, and the output unit 42 is supplied with the ground potential Vss and the second power source 66, a first input signal, which sets the ground potential Vss low, and the potential of the first power source 65 high, is entered at the input terminal 49 of the first CMOS inverter circuit 45.

First, the case where the first input signal makes a LOW to HIGH transition will be described. The output terminal 50 of the first CMOS inverter circuit 45 changes from a HIGH on the first power source 65 to a LOW on the ground potential. The input terminal 51 of the second CMOS inverter circuit 48 is connected to the output terminal 50 of the first CMOS inverter circuit 45, so the output terminal 52 of the second CMOS inverter circuit 48 changes from a LOW on the ground potential to a HIGH on the first power source 65. As a result, in the output unit 42, the NMOS transistor 56 whose gate is connected to the output terminal 50 of the first CMOS inverter circuit 45 is turned off, and the NMOS transistor 55 whose gate is connected to the output terminal 52 of the second CMOS inverter circuit 48 is turned on.

At this moment, the gate of the PMOS transistor 54 goes low, and the PMOS transistor 54 is turned on because the gate of the PMOS transistor 54 is connected to the drain of the NMOS transistor 55. This makes the drain 58 of the PMOS transistor 54 change to a HIGH on the second power source 66.

The gate of the PMOS transistor 53, which is connected to the drain 58 of the PMOS transistor 54, changes to a HIGH on the second power source 66, and the PMOS transistor 53 is turned off. As a result of thus turning the PMOS transistor 53 off and the NMOS transistor 55 on, the drain 57 shared by these transistors goes low.

The input of the inverter circuit 61 operating from the second power source 66 is connected to the drain 57 shared by the two MOS transistors 53 and 55, so the output terminal 62 changes to a HIGH on the second power source 66.

The following is a description of the case where the first input signal makes a HIGH to LOW transition. The output terminal 50 of the first CMOS inverter circuit 45 changes from a LOW on the first power source 65 to a high, and the output terminal 52 of the second CMOS inverter circuit 48 changes from a HIGH on the first power source 65 to a LOW on the ground potential because the input terminal 51 of the second CMOS inverter circuit 48 is connected to the output terminal 50 of the first CMOS inverter circuit 45. As a result, in the output unit 42, the NMOS transistor 56 whose gate is connected to the output terminal 50 of the first CMOS inverter circuit 45 is turned on, and the NMOS transistor 55 whose gate is connected to the output terminal 52 of the second CMOS inverter circuit 48 is turned off.

At this moment, the gate of the PMOS transistor 54, which is connected to the drain 57 of the NMOS transistor 55, goes high, and the PMOS transistor 54 is turned off. As a result, the drain 58 of the PMOS transistor 54 changes to a LOW on the ground potential.

The gate of the PMOS transistor 53, which is connected to the drain 58 of the PMOS transistor 54, changes its potential to a LOW on the ground potential, and the PMOS transistor 53 is turned on. By thus turning the PMOS transistor 53 on and the NMOS transistor 55 off, the drain 57 shared by these transistors changes to a HIGH on the power supply voltage of the second power source 66. Since the input of the inverter circuit 61 operating from the second power source 66 is connected to the shared drain 57, the potential of the output terminal 62 of the output unit 42 changes to a LOW on the ground potential.

As described hereinbefore, the level shift circuit Z shown in FIG. 3 level-shifts a signal entered at the input terminal 49 from the power supply voltage of the first power source 65 to the power supply voltage of the second power source 66, without changing the polarity of the signal.

The prior art level shift circuit operates normally as described above in the normal operation mode when the first and second power sources 65, 66 are both supplied; however, the circuit has a drawback that the output unit 42 suffers from a through current which flows in the following special mode. This problem will be detailed as follows.

In the mixed analog-and-digital LSI, when the digital block unit X is not employed, it is general to set the power down mode for interrupting the power supply from the first power source 65 to the digital block unit X so as to reduce power consumption in the digital block unit X. The power down mode of the digital block unit X involves a problem, which will be detailed as follows.

When the prior art level shift circuit shown in FIG. 3 is used in a mixed analog-and-digital LSI, the structure is as shown in FIG. 5. To be more specific, the level shift circuit Z and the digital block unit X generally share the first power source 65. In this case, when the first power source 65 is interrupted in the power down mode to reduce power consumption in the digital block unit X, the following problem will occur. In the level shift circuit shown in FIG. 3, when the first power source 65 is shut off from the input unit 41, which shares the first power source 65 with the digital block unit X, the output terminal 50 of the first CMOS inverter circuit 45 and the input and output terminals 51, 52 of the second CMOS inverter circuit 48 which operate from the first power source 65 have indefinite potentials. When the threshold voltage of a PMOS transistor is referred to as Vtp and the threshold voltage of a NMOS transistor is referred to as Trn, if the following conditions hold: the ground voltage Vss+Vtn<the potential of the output terminal 50, and the ground voltage Vss+Vtn<the potential of the output terminal 52, then the NMOS transistor 56 whose gate is connected to the output terminal 50 of the first CMOS inverter circuit 45 is turned on, and the NMOS transistor 55 whose gate is connected to the output terminal 52 of the second CMOS inverter circuit 48 is also turned on. At this moment, the gate of the PMOS transistor 54, which is connected to the drain 57 of the NMOS transistor 55, goes low, and the PMOS transistor 54 is turned on. The gate of the PMOS transistor 53, which is connected to the drain 58 of the PMOS transistor 54, changes to a LOW on the ground, and the PMOS transistor 53 is also turned on. As a result of thus turning the PMOS transistors 53, 54 and the NMOS transistors 55, 56 all on, a through current flows from the second power source 66 towards the ground Vss.

Since the potential of the node (shared drain) 57 is determined by the division ratio of the on-resistance between the PMOS transistor 53 and the NMOS transistor 55, when the potential of the node 57 gets close to the switching level of the third inverter circuit 61, the through current also flows in the third inverter circuit 61.

For the above-mentioned reasons, the prior art level shift circuit shown in FIG. 3 has a problem of developing a through current in the power down mode, which leads to an increase in power consumption.

SUMMARY OF THE INVENTION

The object of the present invention is to provide a level shift circuit and a mixed analog-and-digital LSI with low power consumption by eliminating the influence of an indefinite node in the level shift circuit which results from a voltage condition of the first power source so as to prevent the development of a through current.

In order to achieve the object, the present invention provides the output unit of the level shift circuit with a unit for cutting off a through current.

TO be more specific, a level shift circuit of the present invention comprises: an input unit which is connected to a first power source and a ground, and receives a signal changing between a ground potential and a power supply potential of the first power source; an output unit which is connected to a second power source and the ground, and receives a signal outputted from said input unit, voltage-shifts the signal into a signal changing between the ground potential and a power supply potential of the second power source and outputs a voltage-shifted signal; cut off means for cutting off a through current path from the second power source to the ground via said output unit; and a potential detection circuit for detecting a time when the first power source is interrupted and generating a control signal for controlling said cut off means.

Another level shift circuit of the present invention comprises: an input unit which is connected to a first power source and a ground, and receives a signal changing between a ground potential and a power supply potential of the first power source; an output unit which is connected to a second power source and the ground, and receives a signal outputted from said input unit, voltage-shifts the signal into a signal changing between the ground potential and a power supply potential of the second power source and outputs a voltage-shifted signal; cut off means for cutting off a through current path from the second power source to the ground via said output unit, said cut off means receiving from outside a signal for cutting off said through current path when the first power source is interrupted.

Furthermore, in each of the level shift circuits of the present invention, said input unit receives said signal changing between said ground potential and said power supply potential of the first power source from a digital circuit, and said output unit outputs said voltage-shifted signal changing between said ground potential and said power supply potential of the second power source to an analog circuit.

As described hereinbefore, according to the present invention, when the first power source to be provided to the input unit of the level shift circuit is interrupted, the output unit is going to have a current path from the second power source to the ground; however, the current path is cut off by the cut off means as a result that the voltage detection circuit detects the interruption of the first power source or that an outside control signal is entered at the output unit. Consequently, the flow of the through current from the second power source towards the ground is prevented securely.

DETAILED DESCRIPTION OF THE INVENTION

Hereinafter, each preferred embodiment of the present invention will be described with reference to the accompanying drawings.

(Embodiment 1)

Figure 1:
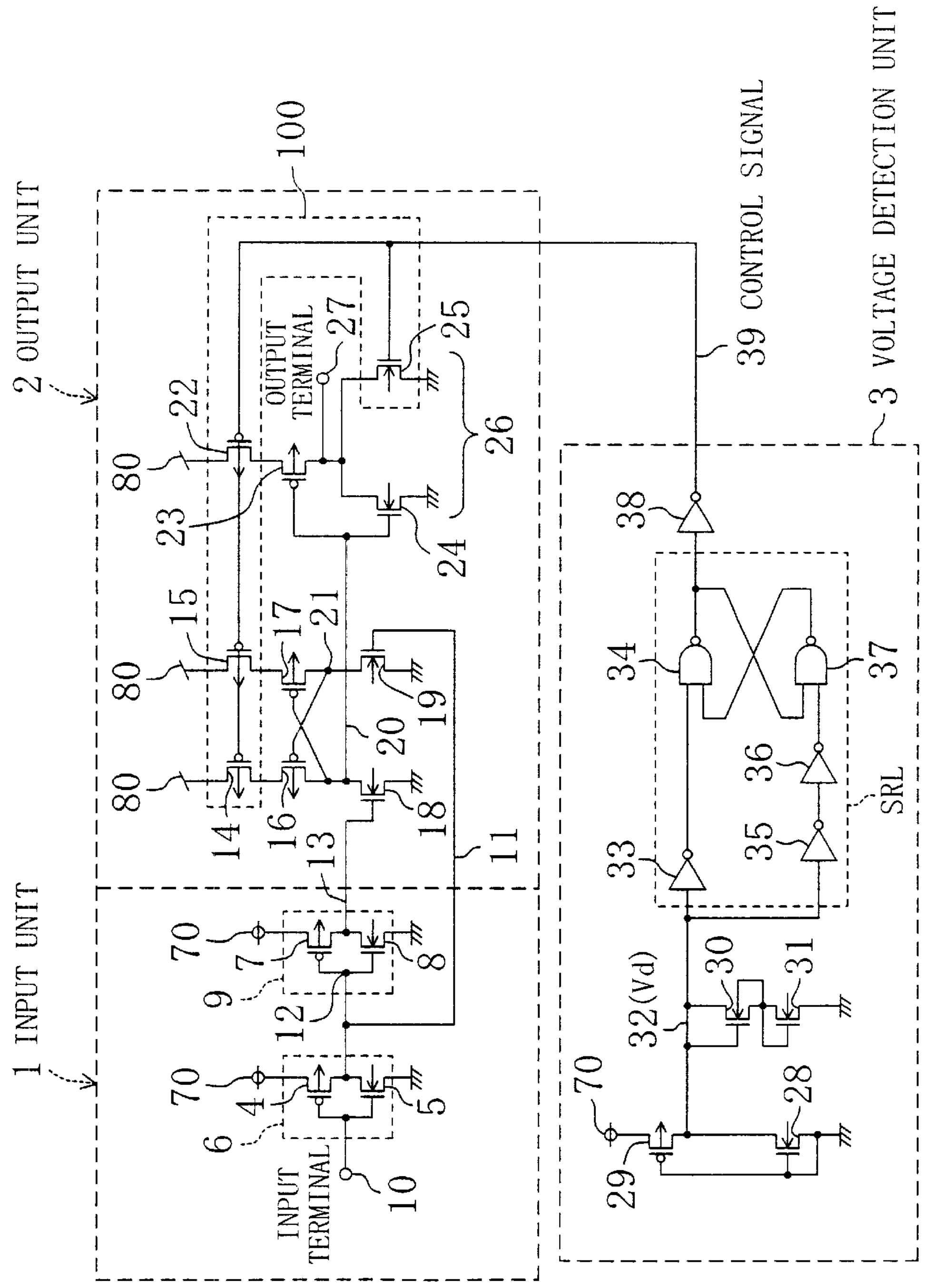
FIG. 1 is a circuit diagram showing the level shift circuit of the first embodiment of the present invention.

FIG. 1 shows the structure of the level shift circuit of the first embodiment of the present invention. The configuration and behavior of the level shift circuit which is composed of CMOS transistors will be described as follows.

The level shift circuit shown in FIG. 1 basically consists of an input unit 1 and an output unit 2. The input unit 1 operates in correction with a ground potential Vss and a first power source 70 having a power supply voltage VDD1. The output unit 2 operates in correction with the ground potential Vss and a second power source 80 having a power supply voltage VDD2, which is higher than the power supply voltage VDD1.

In this level shift circuit, the output unit 2 includes an interruption circuit 100 for interrupting the second power source 80 in the power down mode, and a voltage detection unit (potential detection circuit) 3 for generating a control signal 39 to control the interruption circuit 100. The interruption circuit 100 consists of three PMOS transistors 14, 15 and 22 and a NMOS transistor 25.

The input unit 1 includes a first CMOS inverter circuit 6 and a second CMOS inverter circuit 9. The first CMOS inverter circuit 6 has a PMOS transistor 4 and a NMOS transistor 5 arranged in series between the ground potential Vss and the first power source 70, and their gates and drains are connected to each other. Similarly, the second CMOS inverter circuit 9 has a PMOS transistor 7 and a NMOS transistor 8 arranged in series between the ground potential Vss and the first power source 70, and their gates and drains are connected to each other. The first inverter circuit 6 has an input terminal 10 at which a digital signal is entered from the digital block unit X. The digital signal changes its value between the ground potential Vss and the power supply voltage VDD1 of the first power source 70. The first inverter circuit 6 has an output terminal 11 connected to the input terminal 12 of the second inverter circuit 9.

The output unit 2 operates from the ground potential Vss and the second power source 80. Arranged between the ground potential Vss and the second power source 80 are the PMOS transistor 14 of the interruption circuit 100, a PMOS transistor 16 whose source is connected to the drain of the PMOS transistor 14 and a NMOS transistor 18 which shares a drain 20 with the PMOS transistor 16 and whose source is connected to the ground Vss. The source of the PMOS transistor 14 of the interruption circuit 100 is connected to the second power source 80.

Similarly, arranged between the ground Vss and the second power source 80 are the PMOS transistor 15 of the interruption circuit 100, a PMOS transistor 17 whose source is connected to the drain of the PMOS transistor 15 and a NMOS transistor 19 which shares a drain 21 with the PMOS transistor 17 and whose source is connected to the ground Vss. The source of the PMOS transistor 15 of the interruption circuit 100 is connected to the second power source 80.

The gate of the PMOS transistor 14 in the interruption circuit 100 receives a control signal 39 outputted from the voltage detection unit 3. The gate of the PMOS transistor 16 is connected to the drain 21 shared by the PMOS transistor 17 and the NMOS transistor 19, and the gate of the NMOS transistor 18 is connected to the output terminal 13 of the second inverter circuit 9 in the input unit 1. The gate of the PMOS transistor 15 of the interruption circuit 100 receives the control signal 39 from the voltage detection unit 3. The gate of the PMOS transistor 17 is connected to the drain 20 shared by the PMOS transistor 16 and the NMOS transistor 18, and the gate of the NMOS transistor 19 is connected to the output terminal 11 of the first inverter circuit 6 of the input unit 1.

The PMOS transistor 22 and NMOS transistor 25 of the interruption circuit 100 and the PMOS transistor 23 and NMOS transistor 24 in the output unit 2 compose a two-input NOR circuit 26. The gates of the PMOS transistor 22 and the NMOS transistor 25 in the interruption circuit 100 receives the control signal 39 from the voltage detection unit 3. Each gate of the PMOS transistor 23 and the NMOS transistor 24 in the output unit 2 is connected to the drain 20 shared by the PMOS transistor 16 and the NMOS transistor 18. The two-input NOR circuit 26 has an output terminal 27, which becomes the output of this level shift circuit.

The voltage detection unit 3 has a PMOS transistor 29 whose source is connected to the first power source 70 and whose gate is connected to the ground Vss, and a NMOS transistor 28 which shares a drain with the PMOS transistor 29 and whose gate and source are connected to the ground Vss arranged between the first power source 70 and the ground Vss.

The voltage detection unit 3 further has a NMOS transistor 31 and a NMOS transistor 30. The NMOS transistor 31 has a source connected to the ground Vss, and a gate and a drain which are common. The NMOS transistor 30 has a source and a substrate which are connected to the drain of the NMOS transistor 31, and a gate and a drain which are connected to the drain shared by the PMOS transistor 29 and the NMOS transistor 28. The drain 32 of the NMOS transistor 30 is connected to a R-S latch circuit SRL which operates from the first power source 70. The R-S latch circuit SRL consists of three inverter circuits 33, 35 and 36 and two 2-input NAND circuits 34, 37 which operate from the first power source 70. The drain 32 of the NMOS transistor 30 is connected to the input terminal of the inverter circuit 33, which becomes a set input of the R-S latch circuit SRL, and to the input terminal of the inverter circuit 35, which becomes a reset input of the circuit SRL. The output terminal of the R-S latch circuit SRL is connected to the inverter circuit 38 whose output becomes the control signal 39.

The behavior of the level shift circuit shown in FIG. 1 will be described as follows by starting with the behavior of the voltage detection unit 3.

The voltage of a node 32 (Vd) is represented by the formula 1 below when the respective sizes of the PMOS transistor 29, the NMOS transistor 30 and the NMOS transistor 31 are assumed to be $(W/L)_{29}$, $(W/L)_{30}$ and $(W/L)_{31}$, respectively. In the formula 1, VDD1 indicates the power supply voltage of the first power source 70.

$$Vd=2Vtn+\surd(kp/kn)\cdot\surd(W/L)_{29}\cdot(VDD1-Vtp)\cdot 1/\{\surd(W/L)_{30}+\surd(W/L)_{31}\} \quad \text{(Formula 1)}$$

Figure 6:
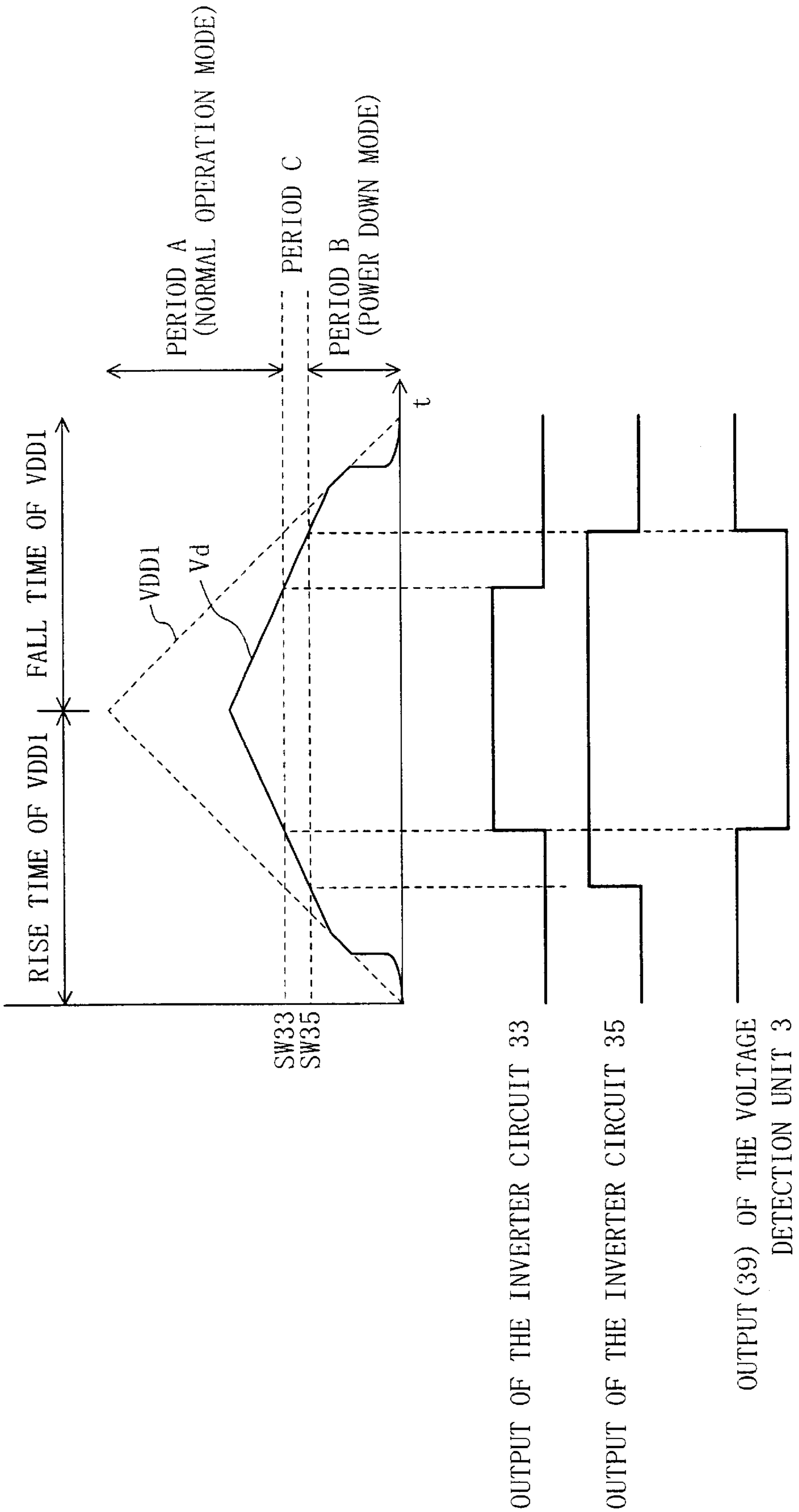
FIG. 6 is a timing diagram showing the behavior of the level shift circuit shown in FIG. 1.

In the R-S latch circuit SRL, the switching voltage $sw_{33}$ of the inverter circuit 33 and the switching voltage $sw_{35}$ of the inverter circuit 35 are designed to be $sw_{33} > sw_{35}$. FIG. 6 is a timing circuit showing the behavior of the level shift circuit, and indicates the relation between the power supply voltage VDD1 of the first power source 70 and the voltage Vd of the node 32, which is found from the formula 1, and the relation between the two switching voltages $sw_{33}$ and $sw_{35}$ and the control signal 39 which is the output of the voltage detection unit 3.

As understood from the relations shown in FIG. 6, in the rise time of the first power source 70 having the power supply voltage VDD1 (the rise time period in FIG. 6), the control signal 39 becomes low when $Vd \geqq sw_{33}$, and becomes high when $Vd < sw_{33}$. On the other hand, in the fall time of the power supply voltage VDD1 of the first power source 70 (the fall time period in FIG. 6), the control signal 39 becomes low when $Vd \geqq sw_{35}$, and becomes high when $Vd < sw_{33}$.

Thus, the voltage detection unit 3 outputs a low control signal 39 in the normal operation mode when the voltage Vd of the node 32 is higher than the switching voltage $sw_{33}$ of the inverter circuit 33, and outputs a high control signal 39 in the power down mode when the voltage Vd of the node 32 is lower than the switching voltage $sw_{35}$ of the inverter circuit 35. Consequently, in the normal operation mode, the low control signal 39 causes the interruption circuit 100 to be in the normal state where the two PMOS transistors 14, 15 are turned on to connect the second power source 80 with the two PMOS transistors 16, 17, and at the same time, the PMOS transistor 22 is turned on and the NMOS transistor 25 is turned off to determine the potential of the output terminal 27 in accordance with the operations of the two MOS transistors 23, 24. On the other hand, in the power down mode, the high control signal 39 turns off the PMOS transistors 14, 15 to disconnect the second power source 80 from the two PMOS transistors 16, 17, or to cut off two through current paths: one from the second power source 80 to the ground via the PMOS transistor 16 and the NMOS transistor 18, and the other from the second power source 80 to the ground via the PMOS transistor 17 and the NMOS transistor 19, and at the same time, the PMOS transistor 22 is turned off and the NMOS transistor 25 is turned on to connect the output terminal 27 to the ground Vss with the potential of the terminal 27 fixed at low.

The following is a description of the behavior of the level shift circuit of the present embodiment.

Figure 4:
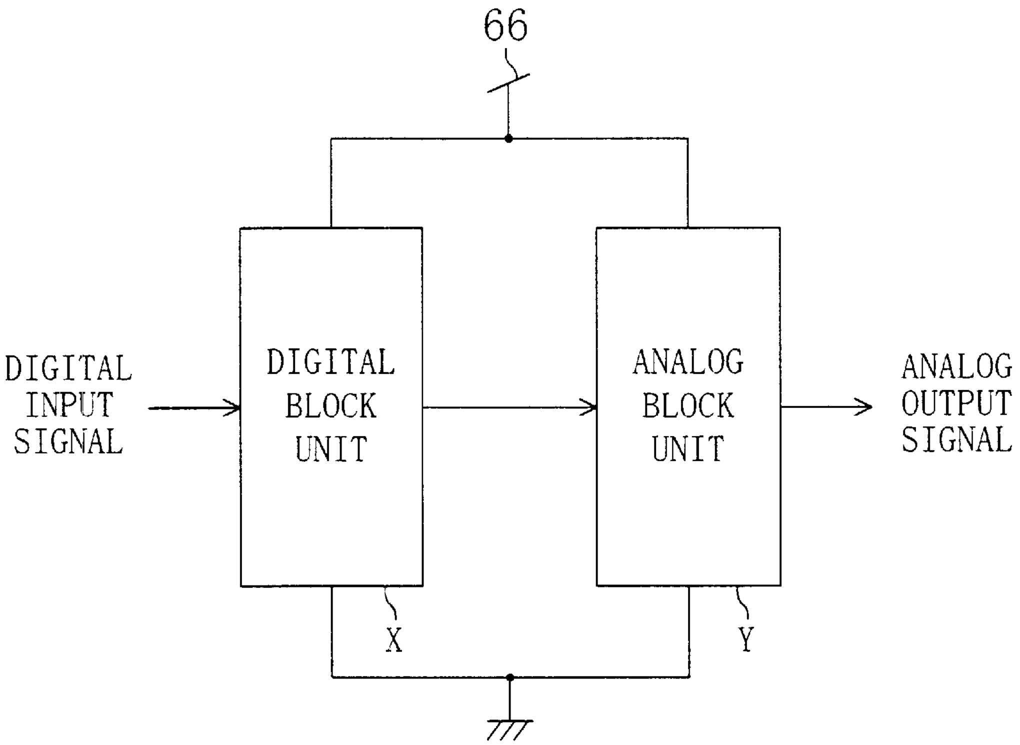
Fig. 4 Prior Art
FIG. 4 is a block diagram showing a prior art mixed analog-and-digital LSI.
Figure 5:
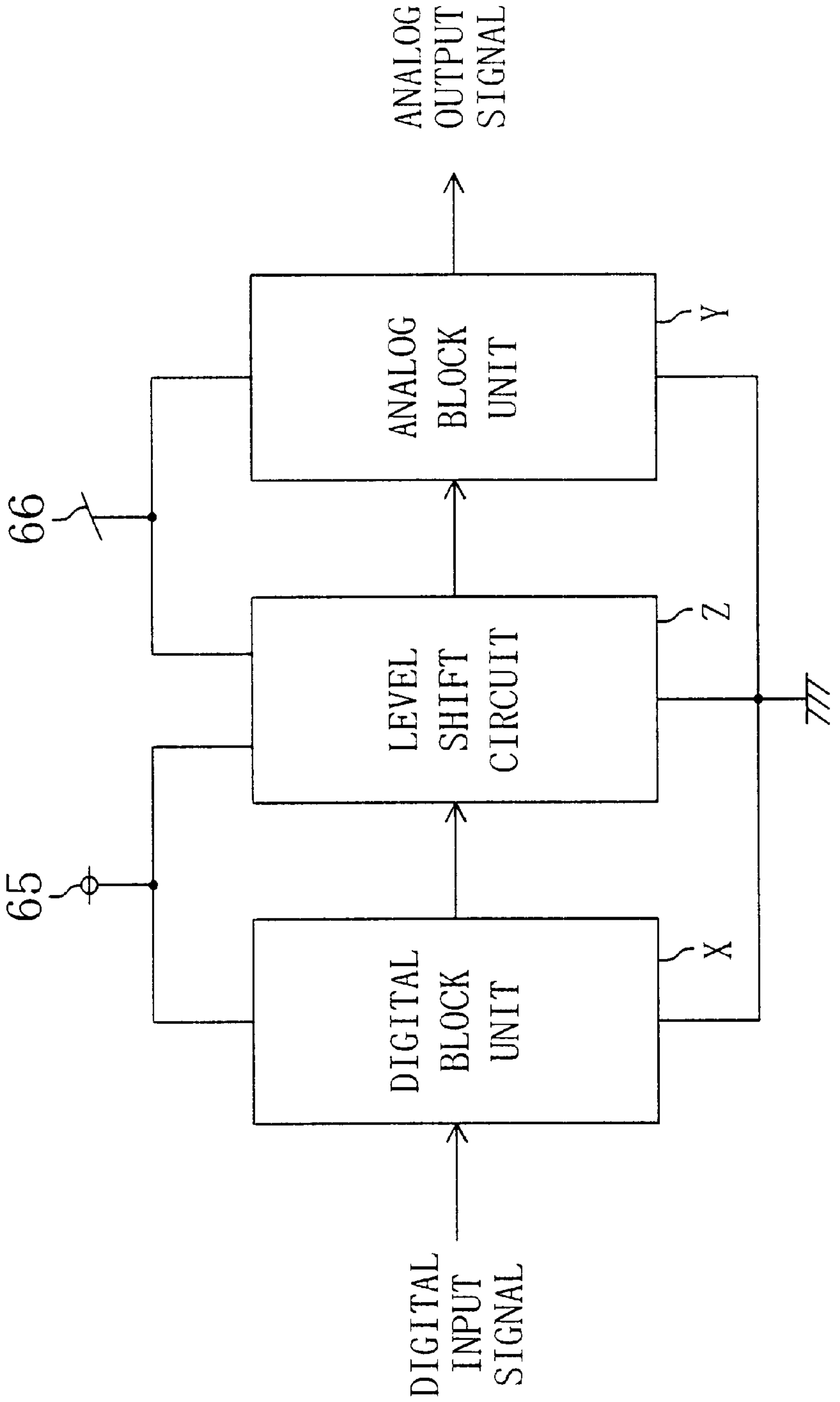
Fig. 5 Prior Art
FIG. 5 is a block diagram showing a mixed analog-and-digital LSI which employs the prior art level shift circuit.

First, the normal operation mode will be described as follows. In this operation mode, the first power source 70 is provided to the digital block unit X shown in FIG. 4 and the level shift circuit of the present embodiment. The power supply voltage VDD1 of the first power source 70 and the voltage Vd of the node 32 are both higher than the switching voltage $sw_{33}$ shown as Period A in FIG. 6. Consequently, the voltage detection unit 3 outputs the low control signal 39. As a result, the three PMOS transistors 14, 15 and 22 in the interruption circuit 100 are all ON, and the power supply voltage from the second power source 80 is in the allowable condition. The NMOS transistor 25 in the interruption circuit 100 is OFF, and the two-input NOR circuit 26 is in the state of being operable in accordance with a change in the potential of the drain 21 shared by the MOS transistors 17, 19.

In the operable state, the input unit 1 is provided with the ground potential Vss and the first power source 70, and the output unit 2 is provided with the ground potential Vss and the second power source 80. In this condition, a first input signal is entered at the input terminal 10. The input terminal 10 sets the ground potential Vss low and the power supply voltage VDD1 of the first power source 70 high.

The case where the first input signal makes a LOW to HIGH transition will be described first. The output terminal 11 of the first CMOS inverter circuit 6 changes from a HIGH on the power supply voltage of the first power source 70 to a LOW on the ground potential. Since the input terminal 12 of the second CMOS inverter circuit 9 is connected to the output terminal 11, the output terminal 13 of the second CMOS inverter circuit 9 changes from a LOW on the ground potential to a HIGH on the power potential of the first power source 70. As a result, the NMOS transistor 19 whose gate is connected to the output terminal 11 of the first CMOS inverter circuit 6 is turned off, and the NMOS transistor 18 whose gate is connected to the output terminal 13 of the second CMOS inverter circuit 9 is turned on. At this moment, the gate of the PMOS transistor 17, which is connected to the drain of the NMOS transistor 18, goes low, and the PMOS transistor 17 is turned on. Consequently, the drain 21 of the PMOS transistor 17 changes to a HIGH on the power supply voltage of the second power source 80. The gate of the PMOS transistor 16, which is connected to the drain 21 of the PMOS transistor 17, changes to a HIGH on the power supply voltage of the second power source 80, and the PMOS transistor 16 is turned off. By thus turning the PMOS transistor 16 off and the NMOS transistor 18 on, the drain 20 shared by these transistors goes low.

The gates o f the PMOS transitor 23 and the NMOS transistor 24, which become the inputs of the two-input NOR circuit 26 operating from the second power source 80, are connected to the shared drain 20, so the output terminal 27 changes to a HIGH on the power supply voltage of the second power source 80. Consequently, a HIGH on the signal entered at the input terminal 10 (the power supply voltage VDD1 of the first power source 70) is voltage-shifted to a HIGH on the power supply voltage VDD2 of the second power source 80, and the voltage-shifted signal is outputted from the output terminal 27.

The following is a description of the case where the first input signal entered at the input terminal 10 changes from a HIGH on the power supply voltage of the first power source 70 to a LOW on the ground potential. The output terminal 11 of the first CMOS inverter circuit 6 changes from a LOW on the ground potential to a HIGH on the power supply voltage of the first power source 70. The input terminal 12 of the second CMOS inverter circuit 9 is connected to the output terminal 11 of the first CMOS inverter circuit 6, so the output terminal 13 of the second CMOS inverter circuit 9 changes from a HIGH on the power supply voltage of the first power source 70 to a LOW on the ground potential. As a result, the NMOS transistor 19 whose gate is connected to the output terminal 11 of the first CMOS inverter circuit 6 is turned on, and the NMOS transistor 18 whose gate is connected to the output terminal 13 of the second CMOS inverter circuit 9 is turned off.

At this moment, the gate of the PMOS transistor 17, which is connected to the drain of the NMOS transistor 18, goes high, and the PMOS transistor 17 is turned off. Consequently, the drain 21 of the PMOS transistor 17 changes to a LOW on the ground potential. The gate of the PMOS transistor 16, which is connected to the drain 21 of the PMOS transistor 17, changes to a LOW on the ground potential, and the PMOS transistor 16 is turned on. By thus turning the PMOS transistor 16 on and the NMOS transistor 18 off, the drain 20 shared by these transistors changes to a HIGH on the power supply voltage of the second power source 80.

The gates of the PMOS transistor 23 and the NMOS transistor PMOS 24, which become the inputs of the two-input NOR circuit 26 operating from the second power source 80, is connected to the drain 20, so the output terminal 27 changes to a LOW on the ground potential.

The behavior of the level shift circuit in the power down mode will be described as follows. In this mode, the first power source 70 is interrupted so as to reduce power consumption in the digital block unit X shown in FIG. 4, and both the first power supply voltage VDD1 of the first power source 70 and the voltage Vd of the node 32 are lower than the switching voltage $sw_{35}$ shown as Period B in FIG. 6. In this condition, the voltage detection unit 3 detects the power supply voltage VDD1 of the first power source to be in a low-voltage state, and outputs the high control signal 39. As a result, in the interruption circuit 100, the PMOS transistors 14, 15 are turned off to interrupt the second power source 80. In this manner, whether the NMOS transistors 18, 19 of the output unit 2 are ON or OFF, it is secured to prevent the flow of the through current from the second power source 80 towards the ground via the two MOS transistors 16, 18 and the flow of the through current from the second power source 80 towards the ground via the two MOS transistors 17, 19. Since the high control signal 39 from the voltage detection unit 3 causes the NMOS transistor 25 in the interruption circuit 100 to be turned on so as to forcibly ground the output terminal 27, the potential of the output terminal 27 is fixed at a LOW on the ground potential. At this moment, the PMOS transistor 22 in the interruption circuit 100 is turned off upon receipt of the high control signal 39 from the voltage detection unit 3, which securely prevents the flow of the through current from the second power source 80 towards the ground.

As described hereinbefore, according to the present embodiment, in the power down mode, the high control signal 39 generated from the voltage detection unit 3 causes the interruption circuit 100 to operate to cut off the flow of the through current inside the output unit 2. This realizes low power consumption even in the power down mode.

In Period C shown in FIG. 6, or in the period when the voltage Vd of the node 32 is between the two switching voltages $sw_{33}$ and $sw_{35}$, hysteresis is provided at the rise time and fall time of the power supply voltage of the first power source 70, and as a result, the level shift circuit of the present embodiment enters in the power down mode at the rise time, and in the normal operation mode at the fall time of the first power source 70.

(Embodiment 2)

Figure 2:
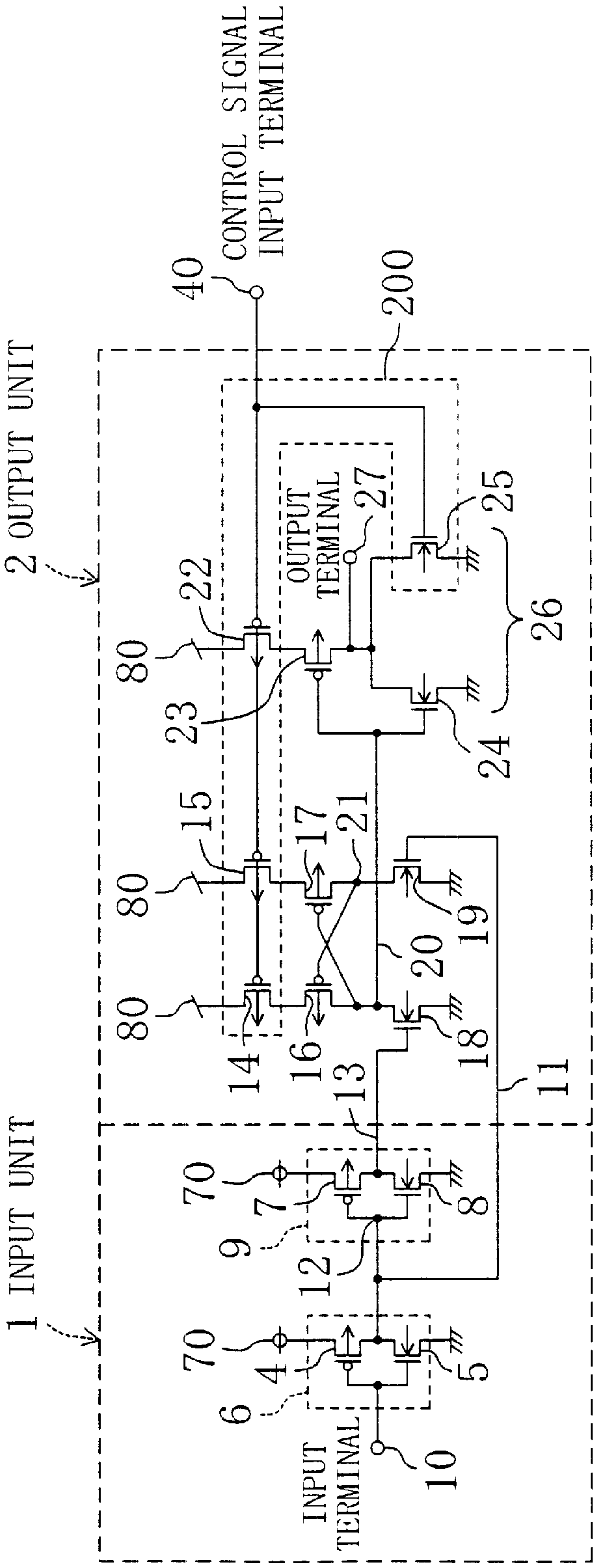
FIG. 2 is a circuit diagram showing the level shift circuit of the second embodiment of the present invention.
Figure 3:
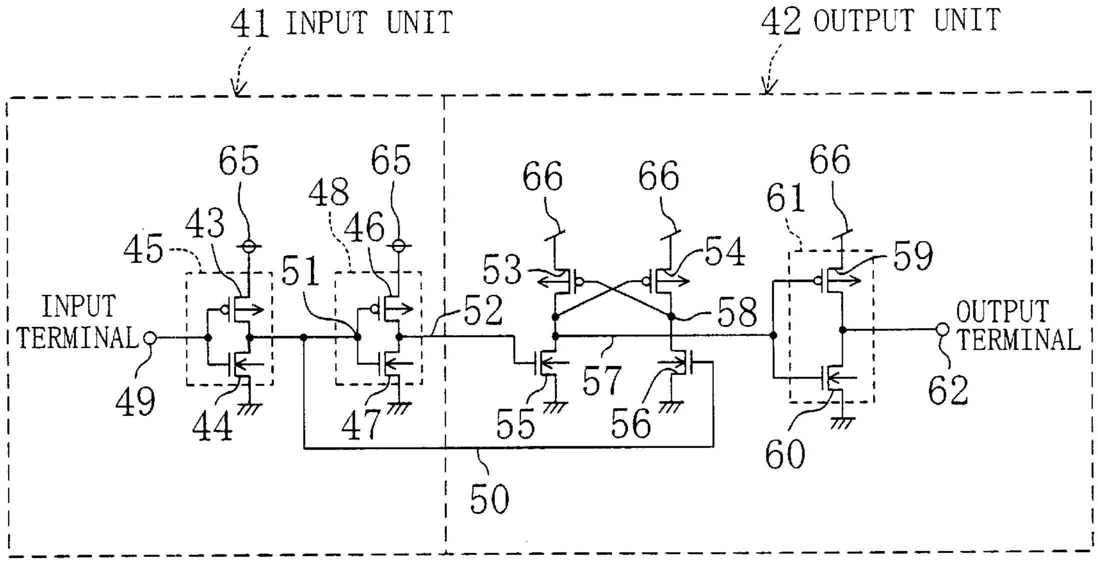
Fig. 3 Prior Art
FIG. 3 is a circuit diagram showing a prior art level shift circuit.
Figure 7:
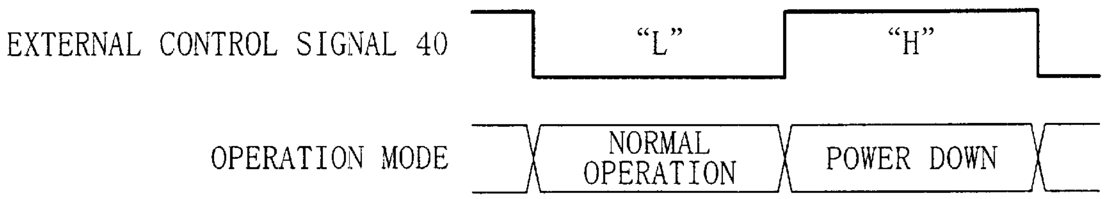
FIG. 7 is a timing diagram showing a control signal provided to the level shift circuit shown in FIG. 2.

FIG. 2 shows the structure of the level shift circuit of the second embodiment of the present invention. The level shift circuit of the present embodiment basically consists of the input unit 1 which operates from the ground Vss and the first power source 70, and the output unit 2 which operates from the ground Vss and the second power source 80. The output unit 2 of this circuit further includes an interruption circuit 200 for interrupting the second power source 80 in the power down mode. The interruption circuit 200 has the same structure as the interruption circuit 100 shown in FIG. 1 except that the circuit 200 receives from the input terminal 40 an external control signal (which becomes low in the normal operation mode and becomes high in the power down mode as shown in FIG. 7) for cutting off the through current path, thereby to control the three PMOS transistors 14, 15 and 22 and the NMOS transistor 25.

Also in the present embodiment, in the normal operation mode when the external control signal is low, the circuit behaves in the same manner as in the first embodiment. In contrast, in the power down mode, the high external control signal 40 causes the PMOS transistors 14, 15 in the interruption circuit 200 to be turned off to interrupt the second power source 80. As a result, there is no through current flowing from the second power source 80 towards the ground whether the NMOS transistors 18, 19 are ON or OFF. In the two-input NOR circuit, the above-mentioned high external control signal 40 causes the PMOS transistor to be turned off, so there is no through current flowing from the second power source 80 via the two-input NOR circuit 26, regardless of the state of the node 20.

In conclusion, according to the present embodiment, an external control signal is supplied in the power down mode through the input terminal 40 by using the interruption circuit 200 to cut off the through current flowing to the output terminal 2. This makes it possible to reduce power consumption in the power down mode in the same manner as in the first embodiment.

What is claimed is:

1. A level shift circuit comprising:

an input unit which is connected to a first power source and a ground, and receives a first signal changing between a ground potential and a power supply potential of the first power source;

an output unit which is connected to a second power source and the ground, and receives a second signal outputted from said input unit, voltage-shifts the second signal into a third signal changing between the ground potential and a power supply potential of the second power source and outputs a voltage-shifted signal;

cut off means for cutting off a through current path from the second power source to the ground via said output unit; and a potential detection circuit for detecting a time when the first power source is interrupted and generating a control signal for controlling said cut off means.

2. The level shift circuit of claim 1, wherein said input unit receives said first signal changing between said ground potential and said power supply potential of the first power source from a digital circuit, and said output unit outputs said voltage-shifted signal changing between said ground potential and said power supply potential of the second power source to an analog circuit.

* * * * *